(12) United States Patent
Wang et al.

(10) Patent No.: US 11,211,581 B2
(45) Date of Patent: Dec. 28, 2021

(54) DISPLAY PANEL, MANUFACTURING METHOD THEREOF, AND DISPLAY DEVICE HAVING MULTIPLE SPACERS

(71) Applicant: BOE TECHNOLOGY GROUP CO., LTD., Beijing (CN)

(72) Inventors: Guoying Wang, Beijing (CN); Zhen Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 26 days.

(21) Appl. No.: 16/640,047

(22) PCT Filed: Sep. 11, 2019

(86) PCT No.: PCT/CN2019/105331
§ 371 (c)(1),
(2) Date: Feb. 18, 2020

(87) PCT Pub. No.: WO2020/177293
PCT Pub. Date: Sep. 10, 2020

(65) Prior Publication Data
US 2021/0135147 A1    May 6, 2021

(30) Foreign Application Priority Data
Mar. 5, 2019  (CN) .......................... 201910164487.X

(51) Int. Cl.
*H01L 51/52*  (2006.01)
*H01L 51/56*  (2006.01)

(52) U.S. Cl.
CPC .......... *H01L 51/525* (2013.01); *H01L 51/524* (2013.01); *H01L 51/5243* (2013.01); *H01L 51/56* (2013.01)

(58) Field of Classification Search
CPC ... H01L 51/525; H01L 51/56; H01L 51/5246; H01L 51/5243; H01L 51/524
See application file for complete search history.

(56) References Cited

U.S. PATENT DOCUMENTS

2005/0140290 A1    6/2005 Park et al.
2015/0041772 A1*   2/2015 Han .................... H01L 27/3248
                                                     257/40
(Continued)

FOREIGN PATENT DOCUMENTS

CN         1638556 A      7/2005
CN       103076699 A      5/2013
(Continued)

OTHER PUBLICATIONS

State Intellectual Property Office of the People's Republic of China, Office Action and Search Report Issued in Application No. 201910164487.X, dated Dec. 24, 2019, 25 pages. (Submitted with Machine Translation).

*Primary Examiner* — Michael Jung
(74) *Attorney, Agent, or Firm* — McCoy Russell LLP

(57) ABSTRACT

A display panel is provided, the display panel including a back plate, a cover plate, a first spacer, and a second spacer, wherein the back plate has a first surface, the cover plate is disposed opposite the back plate and has a second surface opposite the first surface, the first spacer protrudes from an edge of the first surface and has a closed structure, a first connecting end, and a first free end, the first connecting end connected to the back plate, and the first free end extending away from the back plate, the second spacer protrudes from an edge of the second surface and has a closed structure, a second connecting end, and a second free end, the second connecting end connected to the cover plate, and the second (Continued)

free end extending away from the cover plate, and the first free end presses against the second free end.

19 Claims, 6 Drawing Sheets

(56) References Cited

U.S. PATENT DOCUMENTS

| | | | | |
|---|---|---|---|---|
| 2015/0123092 A1* | 5/2015 | Kikuchi | ................ | H01L 51/524 |
| | | | | 257/40 |
| 2016/0013441 A1* | 1/2016 | Hong | .................. | H01L 27/3276 |
| | | | | 257/40 |
| 2016/0343791 A1* | 11/2016 | Liu | ....................... | H01L 25/048 |
| 2017/0194397 A1* | 7/2017 | Kim | .................... | H01L 51/5246 |
| 2017/0229664 A1* | 8/2017 | Watabe | ............... | H01L 51/5246 |
| 2018/0233696 A1* | 8/2018 | Qian | ..................... | H01L 51/525 |
| 2018/0240852 A1* | 8/2018 | Chen | .................. | H01L 27/3258 |
| 2019/0181376 A1* | 6/2019 | Kim | .................... | H01L 27/3246 |
| 2020/0067014 A1* | 2/2020 | Park | ..................... | C07F 7/0838 |

FOREIGN PATENT DOCUMENTS

| | | | |
|---|---|---|---|
| CN | 103809324 | A | 5/2014 |
| CN | 103811432 | A | 5/2014 |
| CN | 205231064 | U | 5/2016 |
| CN | 107210375 | A | 9/2017 |
| TW | 201037799 | A | 10/2010 |

* cited by examiner

DISPLAY PANEL, MANUFACTURING METHOD THEREOF, AND DISPLAY DEVICE HAVING MULTIPLE SPACERS

CROSS-REFERENCE TO RELATED APPLICATIONS

The present application is a U.S. National Phase of International Application No. PCT/CN2019/105331 entitled DISPLAY PANEL, MANUFACTURING METHOD THEREOF, AND DISPLAY DEVICE and filed on Sep. 11, 2019. International Application No. PCT/CN2019/105331 claims priority to Chinese Patent Application No. 201910164487.X, filed on Mar. 5, 2019. The entire contents of each of the above-listed applications are incorporated herein by reference.

TECHNICAL FIELD

The present description relates generally to the field of display technologies, and embodiments of a display panel, a manufacturing method thereof, and a display device.

BACKGROUND

Typically, a packaging process employed in manufacturing organic light-emitting diode (OLED) display panels may include applying a dam encapsulant to a perimeter of a back plate, filling filler glue in the dam encapsulant, and, during alignment of upper and lower covers, spreading the filler glue in a given direction and filling a gap between the upper and lower covers (such a packaging process may be referred to in the art as "dam-and-fill encapsulation"). In order to provide reliability and resilience to moisture, a width of a filler glue layer in the dam encapsulant may be widened or a double dam structure may be adopted, or the filler glue may include a water-absorbing material. However, in order to achieve narrow bezel design, a thin-film package may be employed in a package area, which may reduce the width of the filler glue layer. Therefore, an amount of moisture entering the OLED display panel through the filler glue may increase. The amount of moisture diffusing in the OLED display panel may easily enter highly-susceptible organic materials in a light-emitting layer through defects in regions without thin-film encapsulation, causing an OLED device including the OLED display panel to fail, degrade, or have a shortened useful life. In addition, in existing narrow bezel technologies, a distance of 200 nm or more from the filler glue to an edge of a glass surface included therein may not be subject to any packaging process. As a result, moisture and external oxygen may directly contact the filler glue and thereby affect peripheral pixels of the OLED device as the moisture and external oxygen gradually diffuse into an interior of the OLED display panel. Thus, the lifetime of the OLED device, as well as panel yield and panel uniformity of the OLED display panel therein, may be adversely affected.

SUMMARY

The present disclosure aims to solve or alleviate at least some of the issues existing in the prior art. As described herein, embodiments of a display panel, a manufacturing method thereof, and a display device are proposed. As a first example, the present disclosure provides a display panel having an improved water-blocking effect and adapting to constraints of a narrow bezel design. As a second example, the present disclosure provides a display device including the display panel. As a third example, the present disclosure provides a method for manufacturing the display panel.

An exemplary embodiment of the present disclosure provides a display panel comprising a back plate having a first surface, a cover plate disposed opposite the back plate, the cover plate having a second surface opposite the first surface, a first spacer protruding from an edge of the first surface and having a closed structure, the first spacer comprising a first connecting end connected to the back plate and a first free end extending away from the back plate, and a second spacer protruding from an edge of the second surface and having a closed structure, the second spacer comprising a second connecting end connected to the cover plate and a second free end extending away from the cover plate, wherein the first free end presses against the second free end.

Another exemplary embodiment of the present disclosure provides a display device comprising the display panel.

Yet another exemplary embodiment of the present disclosure provides a method of manufacturing the display panel, the method comprising preparing a back plate and a cover plate, forming a first spacer having a closed structure at an edge of a first surface of the back plate, the first spacer comprising a first connecting end connected to the back plate and a first free end extending away from the back plate, forming a display component in a middle portion of the first surface of the back plate, forming a second spacer having a closed structure at an edge of a second surface of the cover plate, the second spacer comprising a second connecting end connected to the cover plate and a second free end extending away from the cover plate, and coupling the back plate to the cover plate such that the first free end of the first spacer presses against the second free end of the second spacer.

In the display panel, the manufacturing method thereof, and the display device proposed by the present disclosure, when the first spacer and the second spacer are respectively disposed on the edge of the back plate and the cover plate, and when the back plate is then combined with the cover plate to form the display panel, the water-blocking effect is realized by the first free end and the second free end being in contact with one another.

As such, the display panel proposed by the present disclosure may be based on design considerations of a narrow bezel device. By placing the first spacer and the second spacer in face-sharing contact with one another, a barrier to moisture and oxygen is realized, and a path of the moisture and the oxygen diffusing into an interior of the display panel is increased, which may significantly improve a packaging effect, yield, and life of the display panel. Moreover, since there is no need to increase the water-blocking effect by increasing a width of a filler glue layer, processing complexity may be further reduced. The display panel of the present disclosure makes full use of an area between a dam encapsulant and an outer edge of a glass included therein to increase a graphic design by improving the packaging effect without affecting a resolution and a display effect of the display panel as a whole. In addition, design considerations provided by the present disclosure are applicable to a top-emitting device and/or a bottom-emitting device, and thus have a large application space in the field of display technologies.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that

DETAILED DESCRIPTION

The following description relates to a display panel, a manufacturing method thereof, and a display device including the display panel. The specific embodiments of the present invention will be described in detail below with reference to the accompanying figures. It is to be understood that the specific embodiments described herein are merely illustrative and not restrictive. As such, exemplary embodiments of the display panel of the present disclosure will be described below with reference to FIGS. 1-5, 11, and 12.

Figure 1:
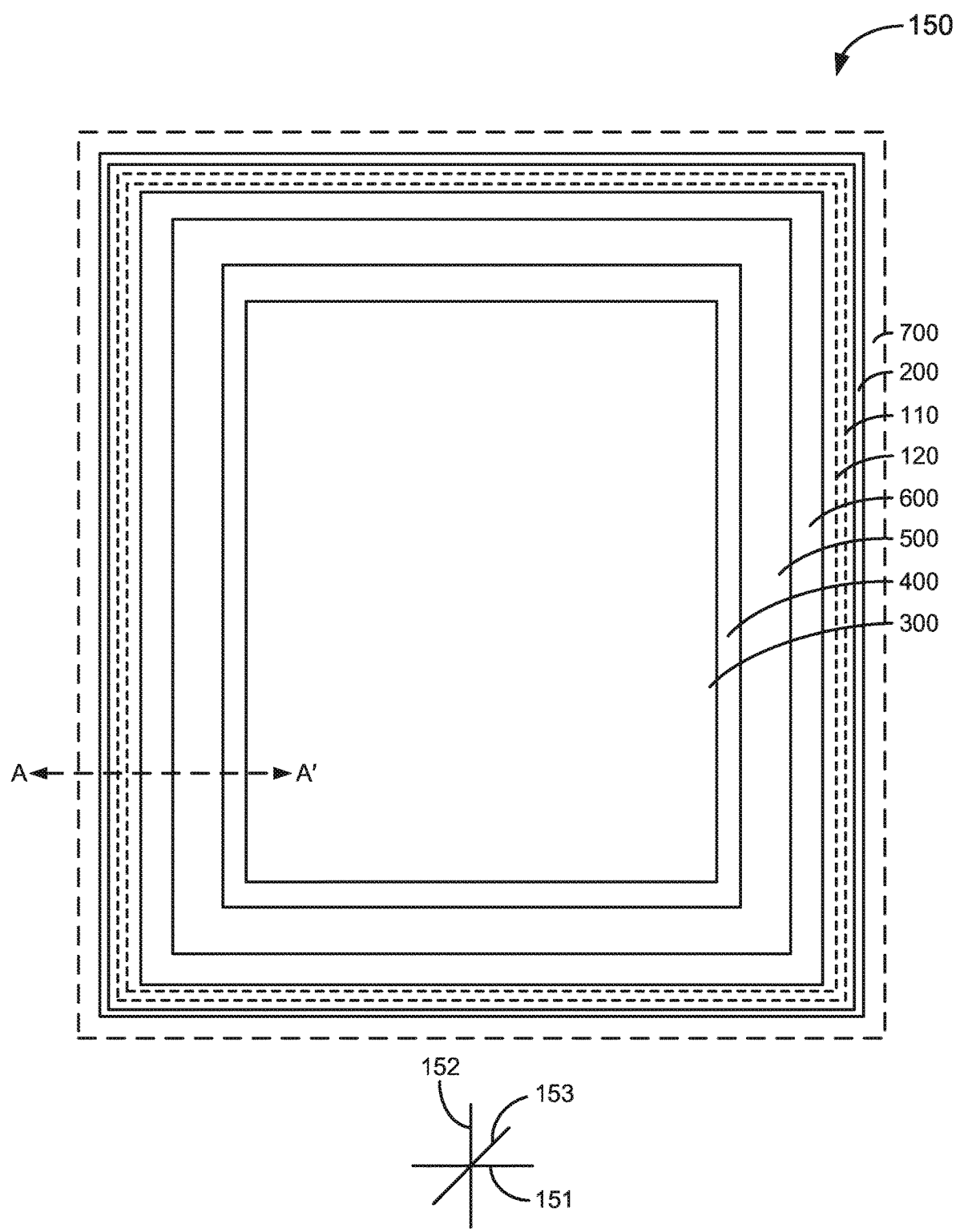
FIG. 1 shows a schematic cross-section of a first example of a display panel according to an embodiment of the present disclosure.
Figure 2:
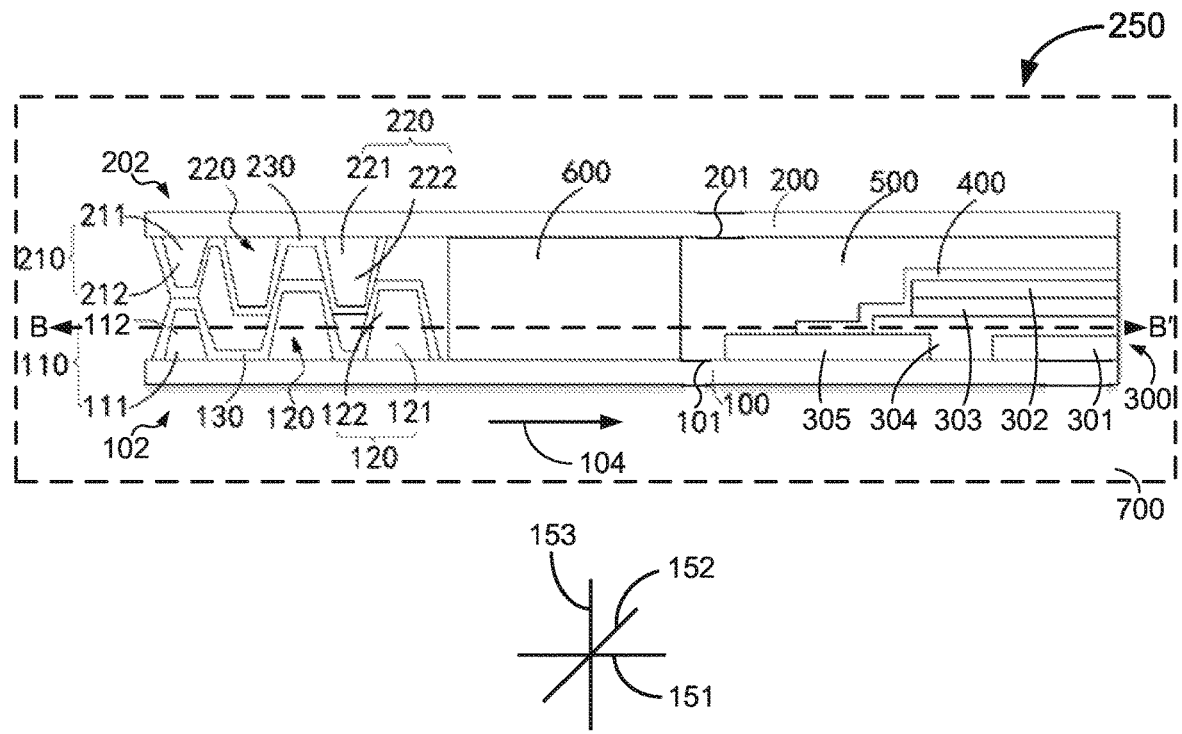
FIG. 2 shows a partial schematic cross-section of the display panel of FIG. 1.

Referring now to FIGS. 1 and 2, a schematic cross-section 150 of a first example of a display panel 700 and a partial schematic cross-section 250 of the display panel 700 are respectively depicted. In an exemplary embodiment, the display panel 700 is described by taking as an example a display panel including an organic light-emitting diode (OLED) device. The display panel 700 includes a back plate 100, a cover plate 200, a first spacer 110, a second spacer 210, two third spacers 120, two fourth spacers 220, a display component 300, a thin film encapsulation layer 400, a filler glue layer 500, and a dam glue layer 600, or dam layer 600 (e.g., a dam encapsulant layer). The partial schematic cross-section 250 of FIG. 2 is taken along a line A-A' of FIG. 1. Similarly, the schematic cross-section 150 of FIG. 1 is taken along a line B-B' of FIG. 1. It will be appreciated that in FIG. 1, and in FIGS. 11 and 12 (described in more detail below), mutually perpendicular axes 151, 152, and 153 define a three-dimensional space relative to the schematic cross-section 150, where the axis 151 and the axis 152 define a plane of the schematic cross-section 150 and the axis 153 is normal to the plane of the schematic cross-section 150. It will be appreciated that the partial schematic cross-section 250 of FIG. 2 is depicted in a plane which is normal to the plane of the schematic cross-section 150.

Figure 3:
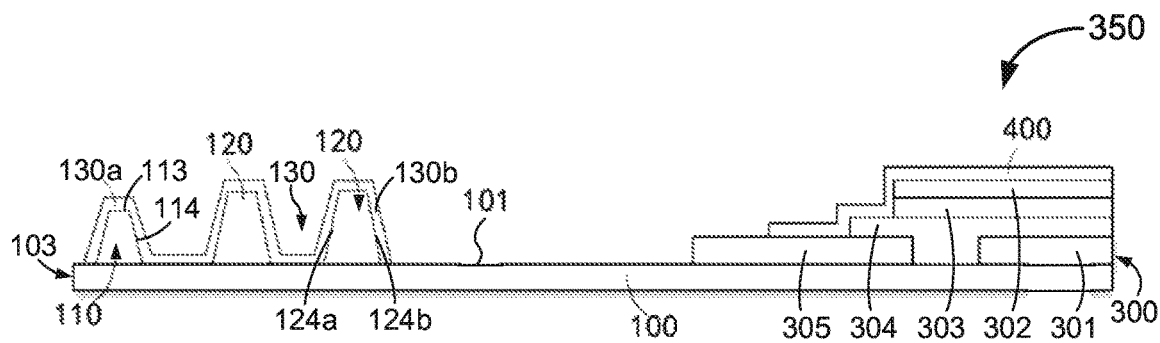
FIG. 3 shows a lower portion of the partial schematic cross-section of FIG. 2.
Figure 4:
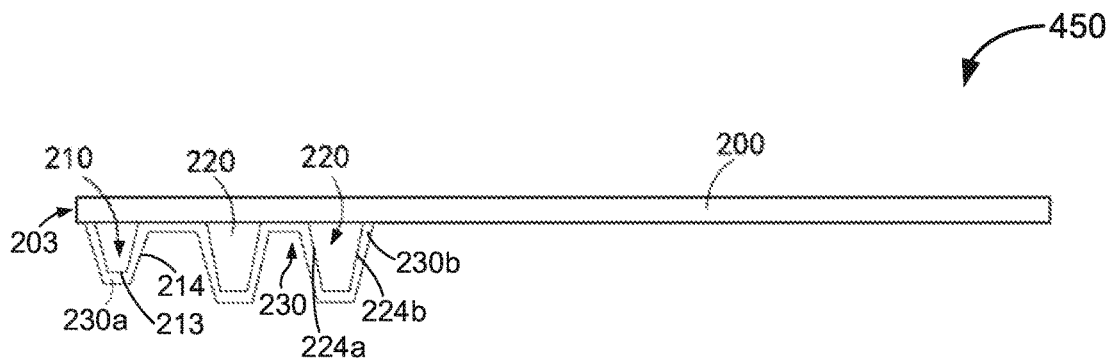
FIG. 4 shows an upper portion of the partial schematic cross-section of FIG. 2.

Referring now to FIGS. 1-4, a lower portion 350 and an upper portion 450 of the partial schematic cross-section 250 are respectively depicted at FIGS. 3 and 4. A structure, connection mode, and functional relationship of each main component of the display panel (e.g., 700) of FIG. 1 will be described in detail below with reference to FIGS. 2-4. Further, though FIGS. 2-4 depict an exemplary embodiment having one first spacer 110, one second spacer 210, two third spacers 120, and two fourth spacers 220, it will be appreciated that greater or fewer of each spacer may be present in a given embodiment without departing from the scope of the present disclosure.

As shown in FIGS. 1-4, the back plate 100 has a first surface 101. The cover plate 200 is disposed opposite to the back plate 100 and has a second surface 201 opposite to the first surface 101. Specifically, the first spacer 110 protrudes from an edge region 102, or edge 102, of the first surface 101 and includes a first connecting end 111 connected to the back plate 100 and a first free end 112 extending away from the back plate 100. In one example, a shape of the first spacer 110 on the first surface 101 is a closed structure (e.g., a closed annular structure) at, or adjacent to, an edge 103 of the back plate 100. The edge of the back plate 100 may be understood as a position on the back plate 100 corresponding to the dam glue layer 600 and the edge 103 of the back plate 100 (that is, corresponding to the edge region 102 of the first surface 101).

Further, the second spacer 210 protrudes from an edge region 202, or edge 202, of the second surface 201 and includes a second connecting end 211 connected to the cover plate 200 and a second free end 212 extending away from the cover plate 200. In one example, a shape of the second spacer 210 on the second surface 201 is a closed structure (e.g., a closed annular structure) at, or adjacent to, an edge 203 of the cover plate 200. The edge of the cover plate 200 may be understood as a position on the cover plate 200 corresponding to the dam glue layer 600 and the edge 203 of the cover plate 200 (that is, corresponding to the edge region 202 of the second surface 201).

When the back plate 100 and the cover plate 200 are combined to form the display panel 700, the first free end 112 of the first spacer 110 presses against the second free end 212 of the second spacer 210. As such, the display panel 700 employs the first spacer 110 pressing against the second spacer 210 to satisfy design considerations of a narrow bezel device, to realize a barrier to external water and oxygen, and to prolong a path of the external water and oxygen into an interior of the display panel, significantly improving a packaging effect, yield and life of the display panel 700. Moreover, since there is no need to increase such a water-blocking effect by increasing a width of the dam glue layer 600, a processing complexity is reduced. Furthermore, the display panel 700 makes full use of an area (e.g., edge regions 102, 202) between an encapsulant (e.g., the dam glue layer 600) and an outer edge of a glass (e.g., edges 103, 203) to increase a graphic design by improving the packaging effect without affecting a resolution and a display effect of the display panel 700 as a whole. In addition, design considerations provided by the present disclosure are applicable to a top-emitting device and/or a bottom-emitting device, and thus have a large application space.

As further shown in FIG. 2, the first free end 112 of the first spacer 110 has a first end surface 113, and the second free end 212 of the second spacer 210 has a second end surface 213. The first end surface 113 of the first free end 112 presses against, and is in face-sharing contact with, the second end surface 213 of the second free end 212 (herein, "face-sharing contact" may refer to two surfaces, such as the first end surface 113 and the second end surface 213, which contact each other such that at least a portion of each of the two surfaces meet at a shared plane). Accordingly, the first spacer 110 and the second spacer 210 press against one another via face-sharing contact of the first end surface 113 and the second end surface 213, thereby improving a barrier effect against external water and oxygen based on design considerations of a narrow bezel device.

As further shown in FIGS. 2 and 3, in some examples, for the first spacer 110, an area of the first connecting end 111 may be larger than an area of the first free end 112. By designing the area of the first connecting end 111 to be larger than the area of the first free end 112 in this way, a first trapezoidal cross-section of the first spacer 110 may be formed along a plane perpendicular to the first surface 101 (e.g., defined by the axes 151 and 153). As such, the first trapezoidal cross-section of the first spacer 110 has a lower base and an upper base, the lower base of the first trapezoidal cross-section corresponding to a portion of the first spacer 110 that is coupled to the first surface 101, and the upper base of the first trapezoidal cross-section corresponding to the first end surface 113 of the first free end 112 of the first spacer 110. A length of the lower base of the first trapezoidal cross-section may be greater than a length of the upper base of the first trapezoidal cross-section, such that the lower base may be referred to as a long base and the upper base may be referred to as a short base. In some examples, and as shown in FIGS. 2 and 3, the first trapezoidal cross-section may be an isosceles trapezoid. Accordingly, to support the water-blocking effect, the first spacer 110 designed to have the first trapezoidal cross-section may provide an improved supporting effect of an overall structure of the display panel 700 after the back plate 100 and the cover plate 200 are aligned and pressed together.

As further shown in FIGS. 2 and 4, in additional or alternative examples, for the second spacer 210, an area of the second connecting end 211 may be larger than an area of the second free end 212. By designing the area of the second connecting end 211 to be larger than the area of the second free end 212 in this way, a second trapezoidal cross-section of the second spacer 210 may be formed along a plane perpendicular to the second surface 201 (e.g., defined by the axes 151 and 153). As such, relative to the back plate 100, the second trapezoidal cross-section may be considered to be an inverted trapezoid. Further, the second trapezoidal cross-section of the second spacer 210 has a lower base and an upper base, the lower base of the second trapezoidal cross-section corresponding to a portion of the second spacer 210 that is coupled to the second surface 201 and the upper base of the second trapezoidal cross-section corresponding to the second end surface 213 of the second free end 212 of the second spacer 210. A length of the lower base of the second trapezoidal cross-section may be greater than a length of the upper base of the second trapezoidal cross-section, such that the lower base may be referred to as a long base and the upper base may be referred to as a short base. In some example, and as shown in FIGS. 2 and 4, the second trapezoidal cross-section may be an isosceles trapezoid.

Accordingly, to support the water-blocking effect, the second spacer 210 designed to have the second trapezoidal cross-section may provide an improved supporting effect of the overall structure of the display panel 700 after the back plate 100 and the cover plate are aligned and pressed together.

The display panel 700 is configured to be formed by combining the back plate 100 with the cover plate 200. In some examples, the back plate 100 and the cover plate 200 may be of equal, or substantially equal, size, such that combining the back plate 100 with the cover plate 200 includes aligning the cover plate 200 with the back plate 100 such that the cover plate 200 and the back plate 100 eclipse one another entirely along the axis 153. Further, a sum of a height of the first spacer 110 relative to the first surface 101 (e.g., a height of the first trapezoidal cross-section) and a height of the second spacer 210 relative to the second surface 201 (e.g., a height of the second trapezoidal cross-section) may be designed to be greater than a distance between the back plate 100 and the cover plate 200 after being combined to form the display panel 700. Accordingly, the first spacer 110 and the second spacer 210 may be pressed and deformed by each other during forming of the display panel 700 such that the first free end 112 of the first spacer 110 and the second free end 212 of the second spacer 210 may be pressed more firmly against one another, thereby improving the barrier to external water and oxygen in the display panel 700. That is, an end surface (e.g., 113) of the first spacer 110 corresponding to the short base of the first trapezoidal cross-section is in face-sharing contact with an end surface (e.g., 213) of the second spacer 210 corresponding to the short base of the second trapezoidal cross-section, thus providing the water-blocking effect of the display panel 700.

Further, in some examples, the height of the first spacer 110 relative to the first surface 101 and the height of the second spacer 210 relative to the second surface 201 may be equal, or substantially equal. Further, in some examples, the first trapezoidal cross-section of the first spacer 110 is a same shape as the second trapezoidal cross-section of the second spacer 210, and may be disposed and symmetrically aligned opposite to each other. Accordingly, when preparing the first spacer 110 on the back plate 100, and when preparing the second spacer 210 on the cover plate 200, similar or equivalent processes or manufacturing equipment may be employed to facilitate a production process.

Further, in some examples, a material of each of the first spacer 110 and the second spacer 210 may be a photo spacer (PS) material, where the PS material is an organic material having an elasticity permitting deformation of the first spacer 110 and the second spacer 210 upon pressing against one another. It will thus be understood that the PS material may be similar to photoresist materials in related art.

As further shown in FIGS. 2 and 3, in some examples, surfaces of the first spacer 110 may be provided with a first water-blocking layer 130a (which may form at least a portion of a lower water-blocking layer 130) such that a design of the first water-blocking layer 130a may be based on the surfaces of the first spacer 110. In some examples, a material of the first water-blocking layer 130a may be a metal material, an alloy material, or an inorganic material. In examples wherein the material of the first water-blocking layer 130a is the metal material, the metal material may include, for example, Mo, Al, Ti, Au, Cu, Hf, Ta, etc. In examples wherein the material of the first water-blocking layer 130a is the alloy material, the alloy material may include, for example, AlNd or MoNb. In examples wherein the material of the first water-blocking layer 130a is the inorganic material, the inorganic material may include, for example, an insulating material such as silicon oxide, silicon nitride, or silicon oxynitride. Further, and as shown in FIGS. 2 and 3, the first water-blocking layer 130a is also disposed at portions of the first surface 101 adjacent to the first spacer 110 (e.g., in the edge region 102).

As further shown in FIGS. 2 and 4, in additional or alternative examples, surfaces of the second spacer 210 may be provided with a second water-blocking layer 230a (which may form at least a portion of an upper water-blocking layer 230) such that a design of the second water-blocking layer 230a may be based on the surfaces of the second spacer 210. In some examples, a material of the second water-blocking layer 230a may be a metal material, an alloy material, or an inorganic material. In examples wherein the material of the second water-blocking layer 230a is the metal material, the metal material may include, for example, Mo, Al, Ti, Au, Cu, Hf, Ta, etc. In examples wherein the material of the second water-blocking layer 230a is the alloy material, the alloy material may include, for example, AlNd or MoNb. In examples wherein the material of the second water-blocking layer 230a is the inorganic material, the inorganic material may include, for example, an insulating material such as silicon oxide, silicon nitride, or silicon oxynitride. Further, and as shown in FIGS. 2 and 4, the second water-blocking layer 230a is also disposed at portions of the second surface 201 adjacent to the second spacer 210 (e.g., in the edge region 202).

As shown in FIGS. 2-4, the third spacers 120 also protrude from the first surface 101, and each of the third spacers 120 is located opposite to an inner side 114 of the first spacer 110. That is, the third spacers 120 are further away from the edge 103 of the back plate 100 than is the first spacer 110. As such, the first surface 101 is convexly provided with the third spacers 120, where a shape of each of the third spacers 120 on the first surface 101 is a closed structure (e.g., a closed annular structure concentric with the closed annular structure of the first spacer 110). Each of the third spacers 120 has two third sides 124a and 124b respectively facing the edge 103 and a center (described below with reference to FIG. 11) of the back plate 100.

Further, the fourth spacers 220 also protrude from the second surface 201, and each of the fourth spacers 220 is located opposite to an inner side 214 of the second spacer 210. That is, the fourth spacers 220 are further away from the edge 203 of the cover plate 200 than is the second spacer 210. As such, the second surface 201 is convexly provided with the fourth spacers 220, where a shape of each of the fourth spacers 220 on the second surface 201 is a closed structure (e.g., a closed annular structure concentric with the closed annular structure of the second spacer 210). Each of the fourth spacers 220 has two fourth sides 224a and 224b respectively facing the edge 203 and a center (described below with reference to FIG. 12) of the cover plate 200.

The third spacers 120 and the fourth spacers 220 are shown as staggered (e.g., alternatingly arranged) along an edge-to-center direction 104 of the back plate 100 (and the cover plate 200), such that at least a portion of one third side (e.g., 124b) of a given third spacer 120 is in face-sharing contact with at least a portion of an adjacent fourth side (e.g., 224a) of an adjacent fourth spacer 220. The display panel 700 may utilize the third spacers 120 and the fourth spacers 220 while achieving the aforementioned barrier to external water and oxygen via the first spacer 110 and the second spacers to prolong the path of the external water and oxygen. Specifically, a staggered, partial face-sharing structure formed by an arrangement of the third spacers 120 and the fourth spacers 220 in a manner as described above may extend the path that the external water and oxygen follow to enter the interior of the display panel 700.

Each of the third spacers 120 has a third connecting end 121 connected to the back plate 100 and a third free end 122 extending away from the back plate 100. Further, each of the fourth spacers 220 has a fourth connecting end 221 connected to the cover plate 200 and a fourth free end 222 extending away from the cover plate 200.

As further shown in FIGS. 2 and 3, in some examples, an area of the third connecting end 121 may be larger than an area of the third free end 122. By designing the area of the third connecting end 121 to be larger than the area of the third free end 122 in this way, a third trapezoidal cross-section of each of the third spacers may be formed along a plane perpendicular to the first surface 101 (e.g., defined by the axes 151 and 153). As such, the third trapezoidal cross-section of each of the third spacers 120 has a lower base and an upper base, the lower base of the third trapezoidal cross-section corresponding to a portion of each of the third spacers 120 that is coupled to the first surface 101. A length of the lower base of the third trapezoidal cross-section may be greater than a length of the upper base of the third trapezoidal cross-section, such that the lower base may be referred to as a long base and the upper base may be referred to as a short base. Further, the third trapezoidal cross-section may have two legs, where each of the two legs respectively correspond to the two third sides 124a, 124b of a given third spacer 120. In some examples, and as shown in FIGS. 2 and 3, the third trapezoidal cross-section may be an isosceles trapezoid.

As further shown in FIGS. 2 and 4, in additional or alternative examples, an area of the fourth connecting end 221 may be larger than an area of the fourth free end 222. By designing the area of the fourth connecting end 221 to be larger than the area of the fourth free end 222 in this way, a fourth trapezoidal cross-section of each of the third spacers may be formed along a plane perpendicular to the second surface 201 (e.g., defined by the axes 151 and 153). As such, the fourth trapezoidal cross-section of each of the fourth spacers 220 has a lower base and an upper base, the lower base of the fourth trapezoidal cross-section corresponding to a portion of each of the fourth spacers 220 that is coupled to the second surface 201. A length of the lower base of the fourth trapezoidal cross-section may be greater than a length of the upper base of the fourth trapezoidal cross-section, such that the lower base may be referred to as a long base and the upper base may be referred to as a short base. Further, the fourth trapezoidal cross-section may have two legs, where each of the two legs respectively correspond to the two fourth sides 224a, 224b of a given fourth spacer 220. In some examples, and as shown in FIGS. 2 and 4, the fourth trapezoidal cross-section may be an isosceles trapezoid.

As such, in some examples, at least a portion of one leg of the third trapezoidal cross-section of a given third spacer 120 is in face-sharing contact with at least a portion of one (adjacent) leg of the fourth trapezoidal cross-section of an adjacent fourth spacer 220.

Further, in some examples, a height of each of the third spacers 120 relative to the first surface 101 and a height of each of the fourth spacer 220 relative to the second surface 201 may be equal, or substantially equal. Further, in some examples, the third trapezoidal cross-section of each of the third spacers 120 is a same shape as the fourth trapezoidal cross-section of each of the fourth spacers 220, and may be disposed and symmetrically aligned opposite to each other.

Accordingly, when preparing the third spacer(s) 120 on the back plate 100, and when preparing the fourth spacer(s) 220 on the cover plate 200, similar or equivalent processes or manufacturing equipment may be employed to facilitate a production process.

Further, in some examples, a material of each of the third spacers 120 and the fourth spacers 220 may be a PS material, such as the PS material described hereinabove.

As further shown in FIGS. 2 and 3, in some examples, surfaces of each of the third spacers 120 may be provided with a third water-blocking layer 130b (which may form at least a portion of the lower water-blocking layer 130) such that a design of the third water-blocking layer 130b may be based on the surfaces of each of the third spacers 120. In some examples, a material of the third water-blocking layer 130b may be a metal material, an alloy material, or an inorganic material. In examples wherein the material of the third water-blocking layer 130b is the metal material, the metal material may include, for example, Mo, Al, Ti, Au, Cu, Hf, Ta, etc. In examples wherein the material of the third water-blocking layer 130b is the alloy material, the alloy material may include, for example, AlNd or MoNb. In examples wherein the material of the third water-blocking layer 130b is the inorganic material, the inorganic material may include, for example, an insulating material such as silicon oxide, silicon nitride, or silicon oxynitride. Further, and as shown in FIGS. 2 and 3, the third water-blocking layer 130b is also disposed at portions of the first surface 101 adjacent to the third spacers 120 (e.g., in the edge region 102). For example, a portion of the first surface 101 exposed between the first spacer 110 and an adjacent third spacer 120, and a portion of the first surface 101 exposed between any two adjacent third spacers 120 may be provided with a portion of the lower water-blocking layer 130 corresponding to the third water-blocking layer 130b.

As further shown in FIGS. 2 and 4, in additional or alternative examples, surfaces of each of the fourth spacers 220 may be provided with a fourth water-blocking layer 230b (which may form at least a portion of the upper water-blocking layer 230) such that a design of the fourth water-blocking layer 230b may be based on the surfaces of each of the fourth spacers 220. In some examples, a material of the fourth water-blocking layer 230b may be a metal material, an alloy material, or an inorganic material. In examples wherein the material of the fourth water-blocking layer 230b is the metal material, the metal material may include, for example, Mo, Al, Ti, Au, Cu, Hf, Ta, etc. In examples wherein the material of the fourth water-blocking layer 230b is the alloy material, the alloy material may include, for example, AlNd or MoNb. In examples wherein the material of the fourth water-blocking layer 230b is the inorganic material, the inorganic material may include, for example, an insulating material such as silicon oxide, silicon nitride, or silicon oxynitride. Further, and as shown in FIGS. 2 and 4, the fourth water-blocking layer 230b is also disposed at portions of the second surface 201 adjacent to the fourth spacers 220 (e.g., in the edge region 202). For example, a portion of the second surface 201 exposed between the second spacer 210 and an adjacent fourth spacer 220, and a portion of the second surface 201 exposed between any two adjacent fourth spacers 220 may be provided with a portion of the upper water-blocking layer 230 corresponding to the fourth water-blocking layer 230b.

In the exemplary embodiment depicted at FIGS. 2-4, two third spacers 120 and two fourth spacers 220 are depicted. Specifically, one third side (e.g., 124a) of a first one of the two third spacers 120 faces the inner side 114 of the first spacers 110 and the other third side (e.g., 124b) of the first one of the two third spacers 120 presses against one fourth side (e.g., 224a) of a first one of the two fourth spacers 220. Further, one third side (e.g., 124a) of a second one of the two third spacers 120 presses against the other fourth side (e.g., 224b) of the first one of the two fourth spacers 220, and the other third side (e.g., 124b) of the second one of the two third spacers 120 presses against one fourth side (e.g., 224a) of a second one of the two fourth spacers 220. The other fourth side (e.g., 224b) of the second one of the two fourth spacers 220 faces a content portion of the display panel 700, the content portion including, for example, the display component 300, etc.

In some embodiments, the third spacers 120 may be one or more third spacers 120. Further, in additional or alternative embodiments, the fourth spacers 220 may be one or more fourth spacers 220. As such, a number of the third spacers 120 and a number of the fourth spacers 220 are not limited to be equal to one another. Since each of the third spacers 120 may be pressed against one or more adjacent fourth spacers 220 on at least one third side (e.g., 124a, 124b) thereof, and each of the fourth spacers 220 may be pressed against one or more adjacent third spacers 120 on at least one fourth side (e.g., 224a, 224b) thereof, a limited number of each of the third spacers 120 and the fourth spacers 220 may be fully utilized to maximize the path of the external water and oxygen entering the interior of the display panel 700, thereby enhancing the water-blocking and packaging effects. Accordingly, in the display panel 700 including the one or more third spacers 120 and the one or more fourth spacers 220, the number of the one or more third spacers 120 may be equal to or off by one from the number of the one or more fourth spacers 220 by design. That is, since in some examples each of the one or more third spacers 120 and each of the one or more fourth spacers 220 are staggered in an alternating pattern along the edge-to-center direction 104 of the back plate 100 (and the cover plate 200), the number of the one or more third spacers 120 may be implicitly limited to be equal or off by one from the number of the one or more fourth spacers 220 by the alternating pattern.

As further shown in FIGS. 2 and 4, the display component 300 may include various subcomponents therein. For example, the display component 300 may at least include a display region 301 (also referred to herein as an AA region 301), a transparent cathode 302, a light-emitting layer 303, a pixel definition layer (PDL) 304, and a gate over array (GOA) circuit 305. It will be appreciated that each of the display region 301, the transparent cathode 302, the light-emitting layer 303, the PDL 304, and the GOA circuit 305 are well-known to those skilled in the art and will therefore only be referenced generally herein as relates to the described embodiments. One or more of the various subcomponents may then be coated with the thin film encapsulation layer 400.

Further, the dam glue layer 600 is disposed between the back plate 100 and the cover plate 200, such that the dam glue layer 600 is located between the display component 300 and each of the first spacer 110 and the second spacer 210. The filler glue layer 500 may then be filled in between the dam glue layer 600 and the display component 300 (and the thin film encapsulation layer 400 coated thereon).

Figure 12:
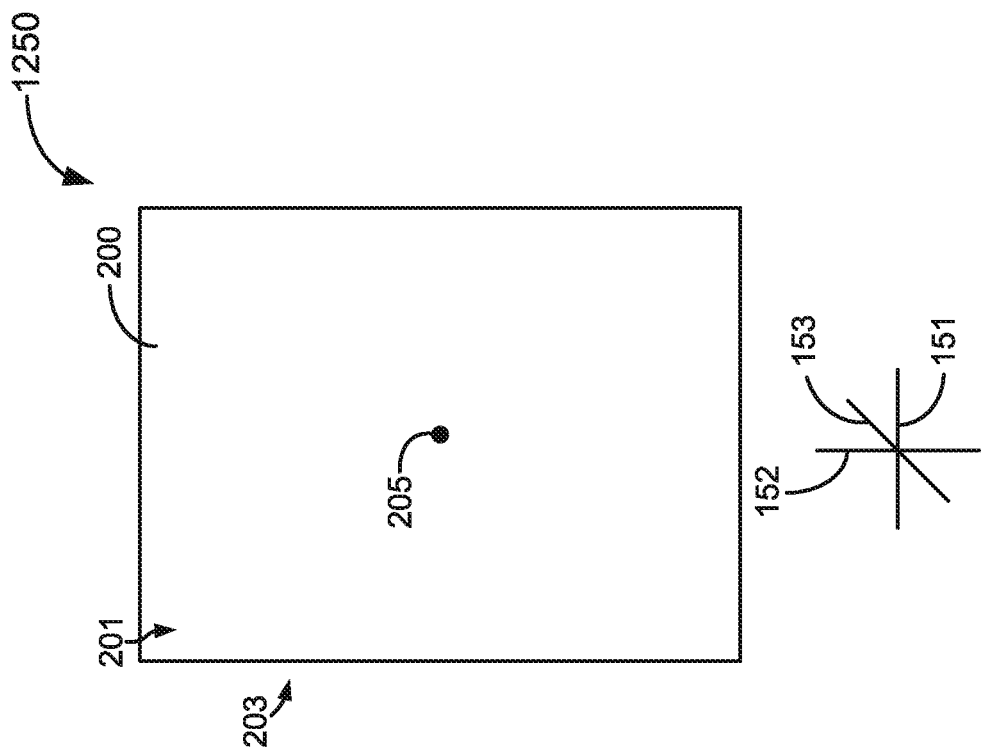
FIG. 12 shows a top view of a cover plate of the display panel.
Figure 11:
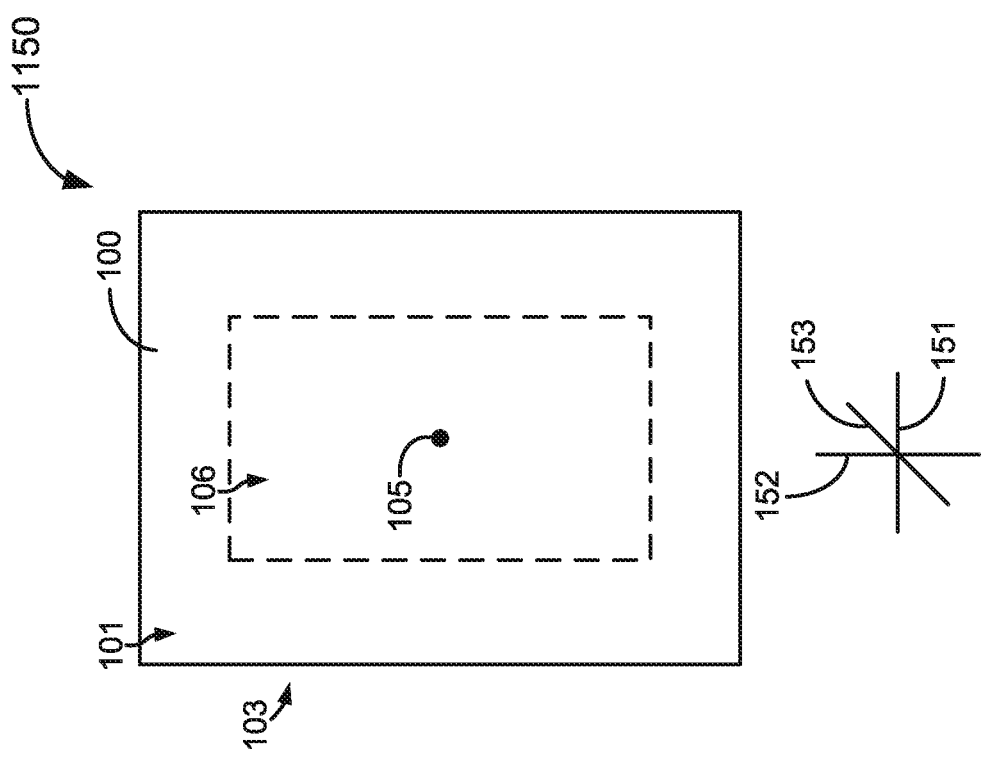
FIG. 11 shows a top view of a back plate of the display panel.

Referring now to FIGS. 11 and 12, a top view 1150 of the back plate 100 and a top view 1250 of the cover plate 200 are respectively depicted to provide examples of various features thereof. A plane of the top view 1150 depicted in FIG. 11 may be defined by the axes 151 and 152, where the axis 153 is normal to the plane of the top view 1150. As shown in FIG. 11, the edge 103 of the back plate 100 circumscribes the back plate 100. Further, a center 105 is shown equidistant along each of the axes 151 and 152 from the edge 103 of the back plate 100. The back plate 100 also includes the first surface 101, which has a middle region 106, or middle portion 106. A plane of the top view 1250 depicted in FIG. 12 may be defined by the axes 151 and 152, where the axis 153 is normal to the plane of the top view 1250. As shown in FIG. 12, the edge 203 of the cover plate 200 circumscribes the cover plate 200. Further, a center 205 is shown equidistant along each of the axes 151 and 152 from the edge 203 of the cover plate 200.

Figure 5:
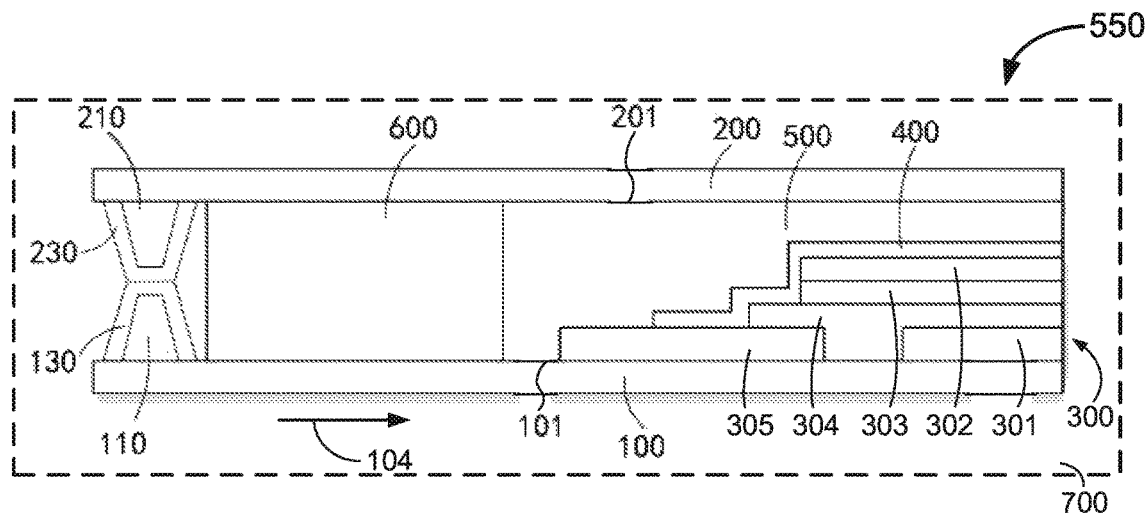
FIG. 5 shows a partial schematic cross-section of a second example of the display panel according to an embodiment of the present disclosure.

Referring now to FIG. 5, a partial schematic cross-section 550 of a second example of the display panel 700 is depicted. As shown in FIG. 5, the display panel 700 includes a back plate 100, a cover plate 200, a first spacer 110, a second spacer 210, a display component 300, a thin film encapsulation layer 400, a filler glue layer 500, and a dam glue layer 600. The display component 300 may further include various subcomponents, such as the display region 301, the transparent cathode 302, the light-emitting layer 303, the PDL 304, and the GOA circuit 305. It will be appreciated that at least some of the components depicted at FIG. 5 are substantially similar to those having like reference indicators as described above with reference to FIGS. 1-4, 11, and 12 and will not be described in detail again for brevity.

In the exemplary embodiment depicted at FIG. 5, the display panel 700 includes one first spacer 110 and one second spacer 210, and does not include one or more third spacers (e.g., 120) and/or one or more fourth spacers (e.g., 220). The first spacer 110 and the second spacer 210 press against one another to provide a barrier against external water and oxygen and to satisfy design considerations of a narrow bezel device. Further, in some examples, surfaces of the first spacer 110 may be provided with the lower water-blocking layer 130. In additional or alternative examples, surfaces of the second spacer 210 may be provided with the upper water-blocking layer 230.

In some embodiments, the first spacer 110 is included in a plurality of first spacers 110 and the second spacer 210 is included in a plurality of second spacers 210, where a number of the plurality of first spacers 110 is equal to a number of the plurality of second spacers 210. Further, positions of the plurality of first spacers 110 and positions of the plurality of second spacers 210 respectively correspond (that is, are opposite) to each other in a manner as described above with reference to FIGS. 1-4. As such, each of a plurality of pairs of a given first spacer 110 and an adjacent (that is, opposite) second spacer 210 may provide the water-blocking and packaging effects by pressing against one another. In additional or alternative embodiments not depicted at FIG. 5, regardless of the number of the plurality of first spacers 110 and the number of the plurality of second spacers 210, one or more third spacers (e.g., 120) and one or more fourth spacers (e.g., 220) may be disposed or removed within the scope of the present disclosure according to a given application.

In embodiments including the plurality of first spacers 110 and the plurality of second spacers 210, the plurality of first spacers 110 protrude from the first surface 101 of the back plate 100, such that the plurality of first spacers 110 are arranged at intervals along the edge-to-center direction 104 of the back plate 100 (and the cover plate 200). Further, the plurality of second spacers 210 protrude from the second surface 201 of the cover plate 200, such that the plurality of second spacers 210 are arranged at intervals along the edge-to-center direction 104 of the back plate 100 (and the cover plate 200). Additionally, the first end surfaces (e.g., 113) of the first free ends 112 of the plurality of first spacers 110 are respectively in face-sharing contact with the second end surfaces (e.g., 213) of the second free ends 212 of the plurality of second spacers 210.

It will be understood that the exemplary embodiments of the display panel illustrated in the drawings and described herein are a small number of the many types of display panels that may employ the principles of the present disclosure. It will further be understood that the principles of the present disclosure are in no way limited to any detail of the display panel, or of any component thereof, illustrated in the drawings or described herein.

Based on the exemplary embodiments of the display panel of the present disclosure described with reference to FIGS. 1-5, 11, and 12, an exemplary embodiment of the display device of the present disclosure will be described below with reference to FIG. 10.

Figure 10:
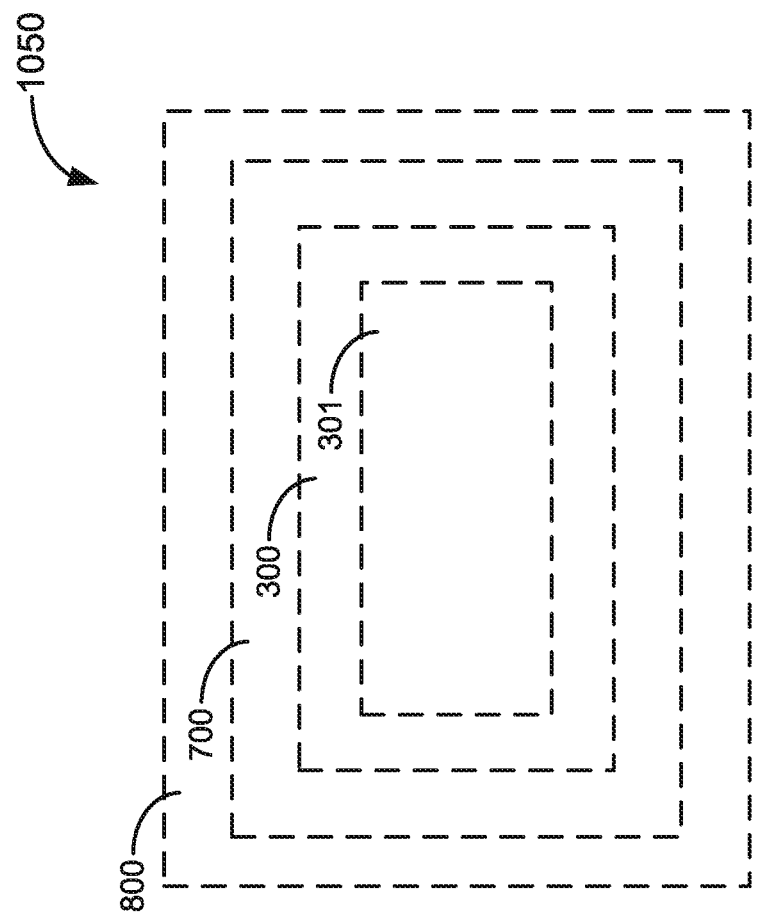
FIG. 10 shows a schematic structural diagram of a display device according to an embodiment of the present disclosure.

Referring now to FIG. 10, a schematic structural diagram 1050 of a display device 800 is depicted. The display device 800 includes various subcomponents, such as the display panel 700 (as shown in FIG. 10). Further, the display panel 700 includes various further subcomponents, such as the display component 300 (as shown in FIG. 10). In some examples, the display component 300 includes various further subcomponents, such as the display region 301 (as shown in FIG. 10). It will be appreciated that each of the display panel 700, the display component 300, and the display region 301 depicted at FIG. 10 is as described above with reference to FIGS. 1-5, 11, and 12 and will not be described in detail again for brevity.

It will be understood that the exemplary embodiments of the display device illustrated in FIG. 10 and described herein is one example of the many types of display devices that may employ the principles of the present disclosure. It will further be understood that the principles of the present disclosure are in no way limited to any detail of the display device, or of any component thereof, illustrated in the drawings or described herein.

Based on the exemplary embodiments of the display panel of the present disclosure described with reference to FIGS. 1-5, 11, and 12, an exemplary embodiment of the manufacturing method of the display panel of the present disclosure will be described below with reference to FIGS. 6-9.

Figure 9:
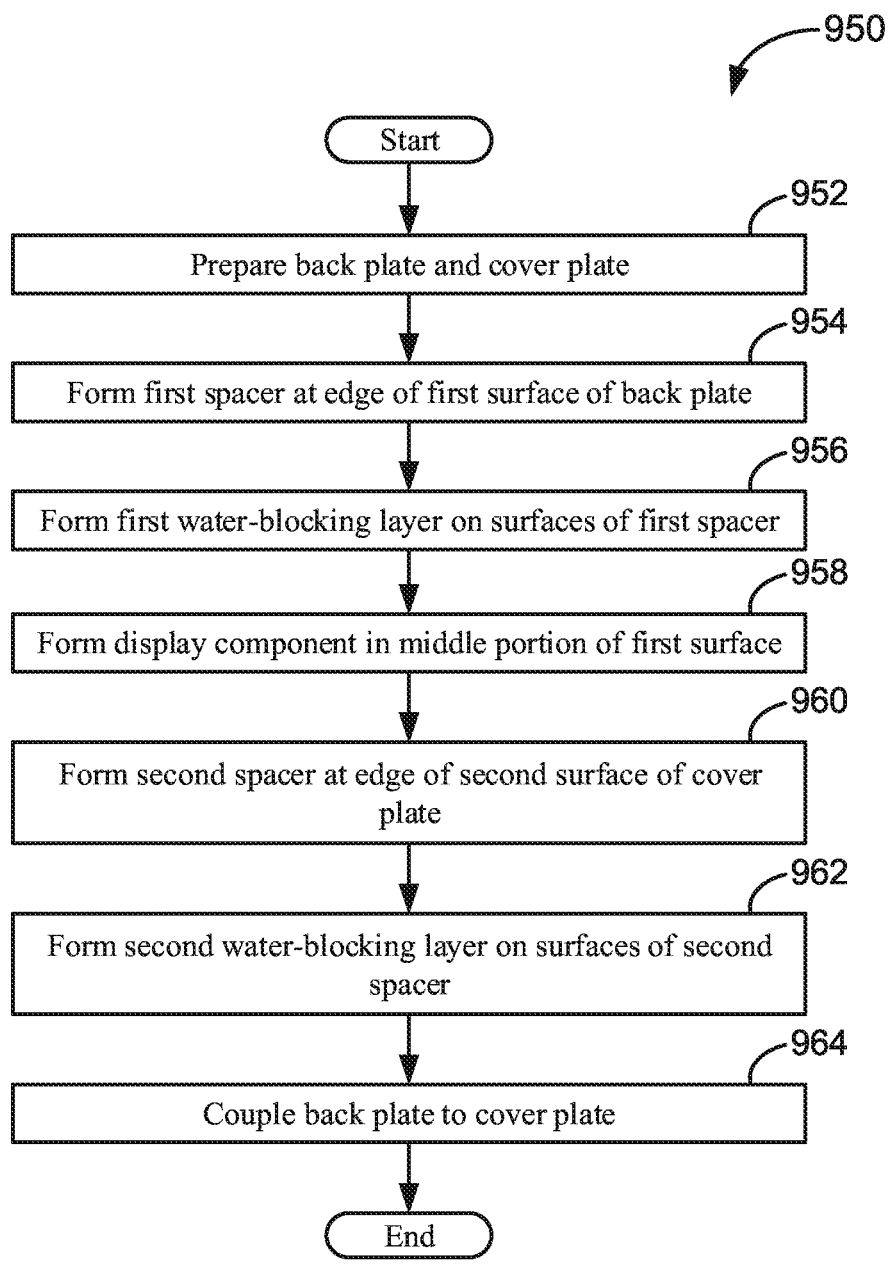
FIG. 9 shows a flow diagram of a method of manufacturing the display panel according to an embodiment of the present disclosure.

Referring now to FIG. 9, a flow diagram 950 of a method of manufacturing a display panel is depicted. The display panel may be the display panel 700 described above with reference to FIGS. 1-5, 11, and 12. As such, components described with reference to FIG. 9 may be examples of corresponding components of the display panel 700 of FIGS. 1-5, 11, and 12.

At 952, the back plate (e.g., 100) and the cover plate (e.g., 200) may be prepared.

At 954, the first spacer (e.g., 110) may be formed at the edge (e.g., 102) of the first surface (e.g., 101) of the back plate (e.g., 100). A shape of the first spacer on the first surface may be a closed structure (e.g., a closed annular structure) at, or adjacent to, the edge of the back plate. The first spacer may include the first connecting end (e.g., 111) connected to the back plate and the first free end (e.g., 112) extending away from the back plate.

Figure 6:
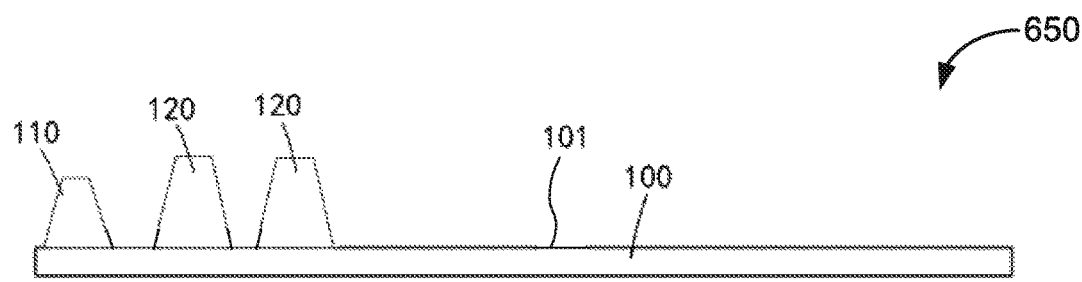
FIG. 6 shows a schematic structural diagram of a first example step of a manufacturing process of the display panel.

Referring now to FIG. 6, a schematic structural diagram 650 of a first example step (e.g., 954) of a manufacturing process of the display panel (e.g., 700) is depicted. As shown in FIG. 6, the first spacer 110 may be disposed in the edge region (e.g., 102) of the first surface 101 of the back plate 100. In one example, the first spacer 110 may be a PS material and may be patterned by a halftone method. The first spacer 110 may include the first connecting end (e.g., 111) connected to the back plate 100 and the first free end (e.g., 112) extending away from the back plate 100.

Referring now to FIG. 9, at 956, the first water-blocking layer (e.g., 130a) may be formed on the surfaces of the first spacer (e.g., 110).

Figure 7:
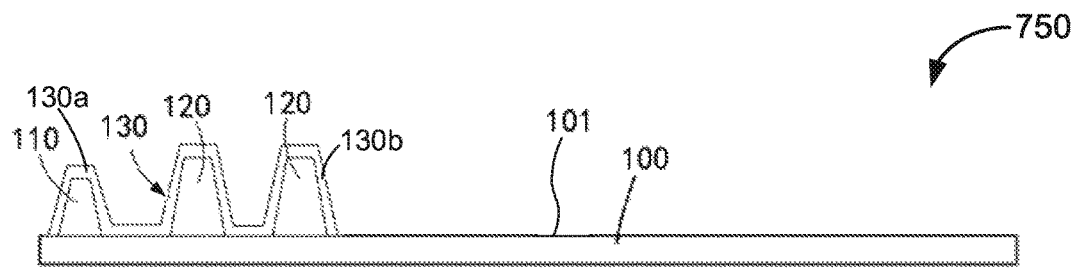
FIG. 7 shows a schematic structural diagram of a second example step of a manufacturing process of the display panel.

Referring now to FIG. 7, a schematic structural diagram 750 of a second example step (e.g., 956) of a manufacturing process of the display panel (e.g., 700) is depicted. As shown in FIG. 7, the first water-blocking layer 130a may be formed on the surfaces of the first spacer 110, where the first water-blocking layer 130a may be included as a portion of the lower water-blocking layer 130. Further, the portion of the lower water-blocking layer 130 corresponding to the first water-blocking layer 130a may also be disposed at portions of the first surface 101 adjacent to the first spacer 110.

As further shown in FIG. 7, the manufacturing method of the display panel (e.g., 700) may optionally include forming the third spacers 120 on the first surface 101 of the back plate 100, such that the third spacers 120 may protrude from the first surface 101 of the back plate 100. Further, the third spacers 120 may be formed so as to be located opposite to the inner side (e.g., 114) of the first spacer 110. The third spacers 120 may have the two third sides (e.g., 124a, 124b) respectively facing the edge (e.g., 103) and the center (e.g., 105) of the back plate 100.

As such, the manufacturing method of the display panel (e.g., 700) may optionally further include forming the third water-blocking layer 130b on the surfaces of each of the third spacers 120, where the third water-blocking layer 130b may be included as a portion of the lower water-blocking layer 130. Further, the portion of the lower water-blocking layer 130 corresponding to the third water-blocking layer 130b may also be disposed at portions of the first surface 101 adjacent to each of the third spacers 120. Each of the first water-blocking layer 130a and the third water-blocking layer 130b may be prepared using a same material and process, and may further be prepared in synchronization so as to form a composite water-blocking layer (that is, the lower water-blocking layer 130).

Referring now to FIG. 9, at 958, the display component (e.g., 300) may be formed in a middle portion (e.g., 106) of the first surface (e.g., 101) of the back plate (e.g., 100).

Figure 8:
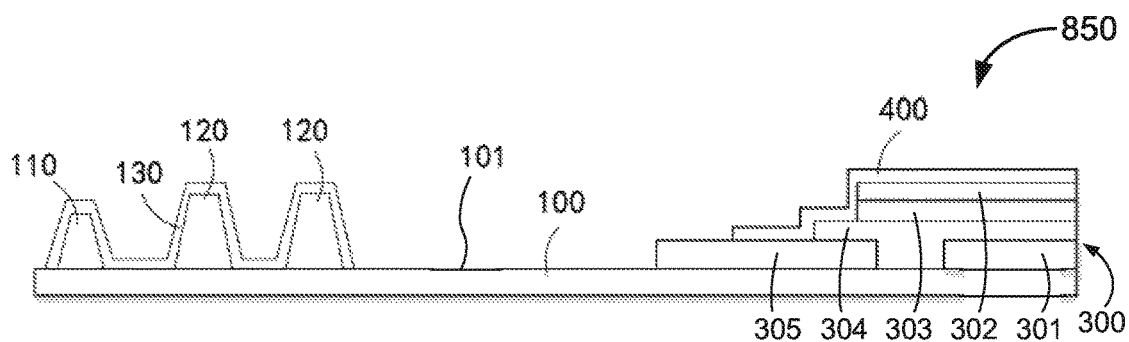
FIG. 8 shows a schematic structural diagram of a third example step of a manufacturing process of the display panel.

Referring now to FIG. 8, a schematic structural diagram 850 of a third example step (e.g., 958) of a manufacturing process of the display panel (e.g., 700) is depicted. As shown in FIG. 8, preparing the display component 300 may specifically include designing and fabricating the display region 301 (or the AA region 301), vapor-depositing the light-emitting layer 303 using an open mask, and sputtering the transparent cathode 302. Further subcomponents of the display component 300 (e.g., the PDL 304, the GOA circuit 305) may also be included within the scope of the present disclosure. Thereafter, film encapsulation may be performed on external surfaces of one or more of the various subcomponents of the display component 300 (e.g., the display region 301, the transparent cathode 302, the light-emitting layer 303, the PDL 304, the GOA circuit 305, etc.) by plasma enhanced chemical vapor deposition to form the thin film encapsulation layer 400. The display component 300 (and the thin film encapsulation layer 400 thereon) may be disposed on a region of the first surface 101 closer to the center (e.g., 105) of the back plate 100 than each of the first spacer 110 and the third spacers 120 (and the lower water-blocking layer 130 thereon).

Referring now to FIG. 2 as an example product of the manufacturing method of the display panel 700, after the thin film encapsulation layer 400 is formed, a dam glue may be coated adjacent to the edge region 102 of the back plate 100 to form the dam glue layer 600. Thereafter, a filler glue may be spin-coated to form the filler glue layer 500, which may provide further support and alignment between the back plate 100 and the cover plate 200. As such, a PS pattern located near the edges (e.g., 103, 203) of the back plate 100 and the cover plate 200 (e.g., the first spacer 110 and the second spacer 210) may be sealingly aligned, and remaining portions of the PS pattern (e.g., the third spacers 120 and the fourth spacers 220) may be staggered.

Referring now to FIG. 9, at 960, the second spacer (e.g., 210) may be formed at the edge (e.g., 202) of the second surface (e.g., 201) of the cover plate (e.g., 200). A shape of the second spacer on the second surface may be a closed structure (e.g., a closed annular structure) at, or adjacent to, the edge of the cover plate. The second spacer may include the second connecting end (e.g., 211) connected to the cover plate and the second free end (e.g., 212) extending away from the cover plate.

Referring now to FIG. 4 as an example product of the manufacturing method of the display panel (e.g., 700), the second spacer 210 may be disposed in the edge region (e.g., 202) of the second surface 201 of the cover plate 200. In one example, the second spacer 210 may be a PS material and may be patterned by a halftone method. The second spacer 210 may include the second connecting end (e.g., 211) connected to the cover plate 200 and the second free end (e.g., 212) extending away from the cover plate 200.

Referring now to FIG. 9, when forming the first spacer (e.g., 110) at 954 and the second spacer (e.g., 210) at 960, the height of the first spacer relative to the first surface (e.g., 101) and the height of the second spacer relative to the second surface (e.g., 201) may be designed to be greater than a distance between the back plate (e.g., 100) and the cover plate (e.g., 200) after being combined to form the display panel (e.g., 700), such that the first spacer and the second spacer are mutually pressed and deformed during the combining.

At 962, the second water-blocking layer (e.g., 230a) may be formed on surfaces of the second spacer (e.g., 210).

Referring now to FIG. 4 as an example product of the manufacturing method of the display panel (e.g., 700), the second water-blocking layer 230a may be formed on the surfaces of the second spacer 210, where the second water-blocking layer 230a may be included as a portion of the upper water-blocking layer 230. Further, the portion of the upper water-blocking layer 230 corresponding to the second water-blocking layer 230a may also be disposed at portions of the second surface 201 adjacent to the second spacer 210.

As further shown in FIG. 4, the manufacturing method used to obtain the example product may optionally include forming the fourth spacers 220 on the second surface 201 of the cover plate 200, such that the fourth spacers 220 may protrude from the second surface 201 of the cover plate 200. Further, the fourth spacers 220 may be formed so as to be located opposite to the inner side 214 of the second spacer 210. The fourth spacers 220 may have the two fourth sides 224a, 124b respectively facing the edge 203 and the center (e.g., 205) of the cover plate 200.

As such, the manufacturing method used to obtain the display panel (e.g., 700) may optionally further include forming the fourth water-blocking layer 230b on the surfaces of each of the fourth spacers 220, where the fourth water-blocking layer 230b may be included as a portion of the upper water-blocking layer 230. Further, the portion of the upper water-blocking layer 230 corresponding to the fourth water-blocking layer 230b may also be disposed at portions of the second surface 201 adjacent to each of the fourth spacers 220. Each of the second water-blocking layer 230a and the fourth water-blocking layer 230b may be prepared using a same material and process, and may further be prepared in synchronization so as to form a composite water-blocking layer (that is, the upper water-blocking layer 230).

Referring now to FIG. 9, the water blocking-layers (e.g., 130a, 230a) may be formed such that, after aligning and pressing together the first spacer (e.g., 110) and the second spacer (e.g., 210) when the back plate (e.g., 100) is correspondingly aligned with the cover plate (e.g., 200), a seal may be provided by the water-blocking layers. As such, the path of external water and oxygen may be directly severed from edges (e.g., 103, 203) of the back plate and the cover plate by means of a combined water-blocking layer.

Further, in optional examples of the manufacturing method of the display panel (e.g., 700) wherein the third spacers (e.g., 120) and the fourth spacers (e.g., 220) are respectively alternately arranged on the back plate (e.g., 100) and the cover plate (e.g., 200), at least a portion of one third side (e.g., 124a, 124b) of a given third spacer may be in face-sharing contact with at least a portion of one fourth side (e.g., 224b, 224a) of an adjacent fourth spacer. In this way, the path of external water and oxygen may be prolonged by the alternating, face-sharing arrangement of the third spacers and the fourth spacers.

At 964, the back plate (e.g., 100) may be coupled to the cover plate (e.g., 200) such that the first free end (e.g., 112) of the first spacer (e.g., 110) presses against the second free end (e.g., 212) of the second spacer (e.g., 210).

It will be understood that the exemplary embodiments of the manufacturing method of the display panel illustrated in FIGS. 6-9 and described herein is one example of the many types of manufacturing methods that may employ the principles of the present disclosure. It will further be understood that the principles of the present disclosure are in no way limited to any detail of the manufacturing method of the display panel, or of any step thereof, illustrated in the drawings or described herein.

As an example, the present disclosure may be applied to an OLED display panel. In some embodiments, the present disclosure may be applied to other thin-film transistor (TFT) based (backplane or BP) processes employable to manufacture different structures. For example, the TFT may be a top gate type, a back channel etch (BCE) type, an etch stop layer (ESL) type, etc. In some embodiments, the present disclosure may also be applied to other types of display panels. For example, the present disclosure may be applied to package preparation of a liquid crystal display (LCD) panel. Therein, a preparation process may be carried out in a vacuum or protective gas environment, and an implementation process may be carried out in a packaged device similarly having a vacuum or protective gas environment.

In additional or alternative embodiments, the present disclosure may be applied to a top gate TFT having various oxides, silicon materials, and organic materials as active layers. For example, a given active layer may include various materials suitable for top-emitting display backplanes based on oxide, silicon, and organic technologies, such as amorphous indium gallium zinc oxide (a-IGZO), ZnON, indium zinc tin oxide (IZTO), amorphous silicon (a-Si), polycrystalline silicon (p-Si), hexathiophene, polythiophene, etc.

In exemplary embodiments herein, various further components may be employed within the scope of the present disclosure. For example, various electrodes, capacitor plates, and signal trace materials may be employed in the display panel, the manufacturing method thereof, and/or the display device of the present disclosure. The electrodes, capacitor plates, and signal trace materials may include conventional metal materials such as Ag, Cu, Al, Mo, etc., alloy materials of the metal materials such as AlNd, MoNb, etc., multilayer materials including the metal material(s) and/or the alloy material(s), such as MoNb/Cu/MoNb, etc., or a stacked structure formed of a transparent conductive oxide [such as indium tin oxide (ITO), aluminum-doped zinc oxide (AZO), etc.] and a metal, such as ITO/Ag/ITO.

As further examples, various buffer, gate insulating (GI), interlayer dielectric (ILD), and passivation (PVX) layers may be employed in the display panel, the manufacturing method thereof, and/or the display device of the present disclosure. The buffer, GI, ILD, and PVX layers may be employed as TFT dielectric and capacitor dielectric layers, and may include, but are not limited to, conventional dielectric materials such as $SiO_x$, $SiN_x$, $SiON$, etc., various recently developed organic insulating materials, or high-k (or high-κ) materials such as $AlO_x$, $HfO_x$, $TaO_x$, etc.

As a further example, an organic insulating dielectric material may be employed in the display panel, the manufacturing method thereof, and/or the display device of the present disclosure. The organic insulating dielectric material may include, but is not limited to, a planarizing material, such as a silicon-based material, an acrylic-based material, or a polyimide-based material.

Exemplary embodiments of the present disclosure are based on realizing a narrow bezel, a longer intrusion path for external water and oxygen, and an improved packaging effect, yield, and life of the display panel. Further, in the exemplary embodiments of the present disclosure, there is no need to increase a water-blocking effect by increasing a width of the filler glue layer or the dam glue layer, and processing complexity may therefore be reduced. The exemplary embodiments of the present disclosure also make full use of an area between an encapsulant (e.g., the dam glue layer) and an outer edge of a glass (e.g., the edge of the back plate or the cover plate) included in the display panel to increase a graphic design by improving the packaging effect without affecting a resolution and a display effect of the display panel as a whole. In addition, the exemplary embodiments of the present disclosure are applicable to a top-emitting device and/or a bottom-emitting device.

In summary, in embodiments of the display panel, the manufacturing method thereof, and the display device proposed by the present disclosure, the first spacer and the second spacer may be respectively disposed on the edge regions of the back plate and the cover plate, such that when the back plate and the cover plate are combined to form the display panel, the water-blocking effect may be realized by correspondingly placing the first free end of the first spacer in face-sharing contact with the second free end of the second spacer. Further, the display panel proposed by the present disclosure may be based on design considerations of a narrow bezel device, such that the first spacer pressed against the second spacer may be used to realize a barrier to external water and oxygen, and to prolong a path of external water and oxygen into an interior of the display panel, significantly improving the packaging effect, yield, and life of the display panel. Moreover, in the display panel proposed by the present disclosure, there is no need to increase a water-blocking effect by increasing a width of the filler glue layer or the dam glue layer, and processing complexity may therefore be reduced. The display panel proposed by the present disclosure also make full use of an area between an encapsulant (e.g., the dam glue layer) and an outer edge of a glass (e.g., the edge of the back plate or the cover plate) included in the display panel to increase a graphic design by improving the packaging effect without affecting a resolution and a display effect of the display panel as a whole. In addition, the design considerations provided by the present disclosure are applicable to a top-emitting device and/or a bottom-emitting device, and thus have a large application space.

In this way, a display panel is provided which has an improved packaging effect as compared to existing OLED panels. The display panel includes a back plate opposite to a cover plate, with a first spacer and a second spacer respectively disposed near edges thereof. The first spacer and the second spacer are pressed against each other, providing a mechanical seal near the edges of the back plate and the cover plate respectively. The technical effect of providing the mechanical seal is that moisture and external oxygen may be largely prevented from entering an interior of the display panel. Further, design considerations herein permit a narrow bezel configuration, providing an optimal display effect.

In one example, a display panel comprises a back plate having a first surface, a cover plate disposed opposite the back plate, the cover plate having a second surface opposite the first surface, a first spacer protruding from an edge of the first surface and having a closed structure, the first spacer comprising a first connecting end connected to the back plate and a first free end extending away from the back plate, and a second spacer protruding from an edge of the second surface and having a closed structure, the second spacer comprising a second connecting end connected to the cover plate and a second free end extending away from the cover plate, wherein the first free end presses against the second free end.

Optionally, the display panel, wherein the first free end of the first spacer has a first end surface, the second free end of the second spacer has a second end surface, and the first end surface of the first free end is in face-sharing contact with the second end surface of the second free end.

Optionally, the display panel, wherein an area of the first connecting end is larger than an area of the first free end, and/or an area of the second connecting end is larger than an area of the second free end.

Optionally, the display panel, wherein the display panel is configured to be formed by combining the back plate with the cover plate, and a sum of a height of the first spacer relative to the first surface and a height of the second spacer relative to the second surface is greater than a distance between the back plate and the cover plate after the display panel is formed, such that the first spacer and the second spacer are pressed and deformed by each other during forming of the display panel.

Optionally, the display panel, wherein the first spacer has a first trapezoidal cross-section along a plane perpendicular to the first surface, where a long base of the first trapezoidal cross-section is coupled to the first surface, the second spacer has a second trapezoidal cross-section along a plane perpendicular to the second surface, where a long base of the second trapezoidal cross-section is coupled to the second surface, and an end surface of the first spacer corresponding to a short base of the first trapezoidal cross-section is in face-sharing contact with an end surface of the second spacer corresponding to a short base of the second trapezoidal cross-section.

Optionally, the display panel, wherein surfaces of the first spacer are provided with a first water-blocking layer, and/or surfaces of the second spacer are provided with a second water-blocking layer.

Optionally, the display panel, wherein the first spacer is included in a plurality of first spacers arranged at intervals along an edge-to-center direction of the back plate, the second spacer is included in a plurality of second spacers arranged at intervals along an edge-to-center direction of the cover plate, and the first end surfaces of the first free ends of the plurality of first spacers are respectively in face-sharing contact with the second end surfaces of the second free ends of the plurality of second spacers.

Optionally, the display panel, wherein the first surface is convexly provided with a third spacer having a closed structure, the third spacer being located opposite to an inner side of the first spacer and having two third sides respectively facing an edge and a center of the back plate, the second surface is convexly provided with a fourth spacer having a closed structure, the fourth spacer being located opposite to an inner side of the second spacer and having two fourth sides respectively facing an edge and a center of the cover plate, and the third spacer and the fourth spacer are staggered along an edge-to-center direction of the back plate, at least a portion of one third side of the third spacer being in face-sharing contact with at least a portion of an adjacent fourth side of the fourth spacer.

Optionally, the display panel, wherein the third spacer has a third connecting end connected to the back plate and a third free end extending away from the back plate, an area of the third connecting end being larger than an area of the third free end, and/or the fourth spacer has a fourth connecting end connected to the cover plate and a fourth free end extending away from the cover plate, an area of the fourth connecting end being larger than an area of the fourth free end.

Optionally, the display panel, wherein the third spacer has a third trapezoidal cross-section, where a long base of the third trapezoidal cross-section is coupled to the first surface, the fourth spacer has a fourth trapezoidal cross-section, where a long base of the fourth trapezoidal cross-section is coupled to the second surface, and at least a portion of one leg of the third trapezoidal cross-section is in face-sharing contact with at least a portion of one leg of the fourth trapezoidal cross-section.

Optionally, the display panel, wherein surfaces of the third spacer are provided with a third water-blocking layer, and/or surfaces of the fourth spacer are provided with a fourth water-blocking layer.

Optionally, the display panel, wherein the third spacer is included in a plurality of third spacers, the fourth spacer is included in a plurality of fourth spacers, and a number of the plurality of third spacers is equal to or off by one from a number of the plurality of fourth spacers.

Optionally, the display panel, further comprising a display component, and a dam layer disposed between the back plate and the cover plate, the dam layer located between the display component and each of the first spacer and the second spacer.

Optionally, a display device comprising the display panel.

In another example, a method of manufacturing a display panel, the method comprising preparing a back plate and a cover plate, forming a first spacer having a closed structure at an edge of a first surface of the back plate, the first spacer comprising a first connecting end connected to the back plate and a first free end extending away from the back plate, forming a display component in a middle portion of the first surface of the back plate, forming a second spacer having a closed structure at an edge of a second surface of the cover plate, the second spacer comprising a second connecting end connected to the cover plate and a second free end extending away from the cover plate, and coupling the back plate to the cover plate such that the first free end of the first spacer presses against the second free end of the second spacer.

It will be appreciated that the various embodiments of the present disclosure are described in a progressive manner, wherein each embodiment focuses on differences from other embodiments, and similar parts between the various embodiments may be referred to each other.

It will be appreciated that ordinal terms such as "first" and "second" are used merely to distinguish one entity or operation from another entity or operation, and do not necessarily require or imply any such actual relationship or order between these entities or operations.

FIGS. 1-8 show example configurations with relative positioning of the various components described herein. If shown directly contacting each other, or directly coupled, then such elements may be referred to as directly contacting or directly coupled, respectively, at least in one example. Similarly, elements shown contiguous or adjacent to one another may be contiguous or adjacent to each other, respectively, at least in one example. As an example, components laying in face-sharing contact with each other may be referred to as in face-sharing contact. As another example, elements positioned apart from each other with only a space there-between and no other components may be referred to as such, in at least one example. As yet another example, elements shown above/below one another, at opposite sides to one another, or to the left/right of one another may be referred to as such, relative to one another. Further, as shown in the figures, a topmost element or point of element may be referred to as a "top" of the component and a bottommost element or point of the element may be referred to as a "bottom" of the component, in at least one example. As used herein, top/bottom, upper/lower, above/below, may be relative to a vertical axis of the figures and used to describe positioning of elements of the figures relative to one another. As such, elements shown above other elements are positioned vertically above the other elements, in one example. As yet another example, shapes of the elements depicted within the figures may be referred to as having those shapes (e.g., such as being circular, straight, planar, curved, rounded, chamfered, angled, or the like). Further, elements shown intersecting one another may be referred to as intersecting elements or intersecting one another, in at least one example. Further still, an element shown within another element or shown outside of another element may be referred as such, in one example.

The following claims particularly point out certain combinations and sub-combinations regarded as novel and non-obvious. These claims may refer to "an" element or "a first" element or the equivalent thereof. Such claims should be understood to include incorporation of one or more such elements, neither requiring nor excluding two or more such elements. Other combinations and sub-combinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

It is to be understood that the above embodiments are merely exemplary embodiments employed to explain the principles of the inventive concepts, but the inventive concepts are not limited thereto. Various modifications and improvements can be made by those skilled in the art without departing from the spirit and scope of the disclosure, and such modifications and improvements are also considered to be within the scope of the disclosure.

The invention claimed is:

1. A display panel, comprising:
a back plate having a first surface;
a cover plate disposed opposite the back plate, the cover plate having a second surface opposite the first surface;
a first spacer protruding from an edge of the first surface and having a closed structure, the first spacer comprising a first connecting end connected to the back plate and a first free end extending away from the back plate;
a second spacer protruding from an edge of the second surface and having a closed structure, the second spacer comprising a second connecting end connected to the cover plate and a second free end extending away from the cover plate;
a plurality of third spacers positioned opposite to an inner side of the first spacer; and
a plurality of fourth spacers positioned opposite to an inner side of the second spacer;
wherein the first free end presses against the second free end.

2. The display panel of claim 1, wherein
the first free end of the first spacer has a first end surface;
the second free end of the second spacer has a second end surface; and
the first end surface of the first free end is in face-sharing contact with the second end surface of the second free end.

3. The display panel of claim 1, wherein
an area of the first connecting end is larger than an area of the first free end; and/or
an area of the second connecting end is larger than an area of the second free end.

4. The display panel of claim 1, wherein
the display panel is configured to be formed by combining the back plate with the cover plate; and
a sum of a height of the first spacer relative to the first surface and a height of the second spacer relative to the second surface is greater than a distance between the back plate and the cover plate after the display panel is formed, such that the first spacer and the second spacer are pressed and deformed by each other during forming of the display panel.

5. The display panel of claim 1, wherein
the first spacer has a first trapezoidal cross-section along a plane perpendicular to the first surface, where a long base of the first trapezoidal cross-section is coupled to the first surface;
the second spacer has a second trapezoidal cross-section along a plane perpendicular to the second surface, where a long base of the second trapezoidal cross-section is coupled to the second surface; and
an end surface of the first spacer corresponding to a short base of the first trapezoidal cross-section is in face-sharing contact with an end surface of the second spacer corresponding to a short base of the second trapezoidal cross-section.

6. The display panel of claim 1, wherein
surfaces of the first spacer are provided with a first water-blocking layer; and/or
surfaces of the second spacer are provided with a second water-blocking layer.

7. The display panel of claim 1, wherein
the first spacer is included in a plurality of first spacers arranged at intervals along an edge-to-center direction of the back plate;
the second spacer is included in a plurality of second spacers arranged at intervals along an edge-to-center direction of the cover plate; and
the first end surfaces of the first free ends of the plurality of first spacers are respectively in face-sharing contact with the second end surfaces of the second free ends of the plurality of second spacers.

8. The display panel of claim 1, wherein
the first surface is convexly provided with at least one of the third spacers having a closed structure and having two third sides respectively facing an edge and a center of the back plate;
the second surface is convexly provided with at least one of the fourth spacers having a closed structure and having two fourth sides respectively facing an edge and a center of the cover plate; and
the at least one of the third spacers and the at least one of the fourth spacers are staggered along an edge-to-center direction of the back plate, at least a portion of one third side of the at least one of the third spacers being in face-sharing contact with at least a portion of an adjacent fourth side of the at least one of the fourth spacers.

9. The display panel of claim 8, wherein
the at least one of the third spacers has a third connecting end connected to the back plate and a third free end extending away from the back plate, an area of the third connecting end being larger than an area of the third free end; and/or
the at least one of the fourth spacers has a fourth connecting end connected to the cover plate and a fourth free end extending away from the cover plate, an area of the fourth connecting end being larger than an area of the fourth free end.

10. The display panel of claim 8, wherein
the at least one of the third spacers has a third trapezoidal cross-section, where a long base of the third trapezoidal cross-section is coupled to the first surface;
the at least one of the fourth spacers has a fourth trapezoidal cross-section, where a long base of the fourth trapezoidal cross-section is coupled to the second surface; and
at least a portion of one leg of the third trapezoidal cross-section is in face-sharing contact with at least a portion of one leg of the fourth trapezoidal cross-section.

11. The display panel of claim 8, wherein
surfaces of the at least one of the third spacers are provided with a third water-blocking layer; and/or
surfaces of the at least one of the fourth spacers are provided with a fourth water-blocking layer.

12. The display panel of claim 8, wherein
a number of the plurality of third spacers is equal to or off by one from a number of the plurality of fourth spacers.

13. The display panel of claim 1, further comprising:
a display component; and
a dam layer disposed between the back plate and the cover plate, the dam layer located between the display component and each of the first spacer and the second spacer.

14. A display device, comprising:
a display panel, the display panel comprising:
a back plate having a first surface;
a cover plate disposed opposite the back plate, the cover plate having a second surface opposite the first surface;
a first spacer protruding from an edge of the first surface and having a closed structure, the first spacer comprising a first connecting end connected to the back plate and a first free end extending away from the back plate;
a second spacer protruding from an edge of the second surface and having a closed structure, the second spacer comprising a second connecting end connected to the cover plate and a second free end extending away from the cover plate;
a plurality of third spacers positioned opposite to an inner side of the first spacer;
a plurality of fourth spacers positioned opposite to an inner side of the second spacer; and
a display component disposed in a middle portion of the first surface of the back plate;
wherein the first free end presses against the second free end.

15. A method of manufacturing a display panel, the method comprising:
preparing a back plate and a cover plate;
forming a first spacer having a closed structure at an edge of a first surface of the back plate, the first spacer comprising a first connecting end connected to the back plate and a first free end extending away from the back plate;
forming a display component in a middle portion of the first surface of the back plate;
forming a second spacer having a closed structure at an edge of a second surface of the cover plate, the second spacer comprising a second connecting end connected to the cover plate and a second free end extending away from the cover plate;
coupling the back plate to the cover plate such that the first free end of the first spacer presses against the second free end of the second spacer;
forming a plurality of third spacers on the first surface of the back plate, the plurality of third spacers being located opposite to an inner side of the first spacer; and
forming a plurality of fourth spacers on the second surface of the cover plate, the plurality of fourth spacers being located opposite to an inner side of the second spacer.

16. The method of claim 15, further comprising:
forming a first water-blocking layer on surfaces of the first spacer; and/or
forming a second water-blocking layer on surfaces of the second spacer.

17. The method of claim 15, further comprising:
forming a third water-blocking layer on surfaces of the plurality of third spacers; and/or
forming a fourth water-blocking layer on surfaces of the plurality of fourth spacers.

18. The method of claim 15, wherein
the plurality of third spacers and the plurality of fourth spacers are alternately arranged on the back plate and the cover plate, respectively; and at least a portion of a side of each of the plurality of third spacers is respectively in face-sharing contact with at least a portion of a side of an adjacent one of the plurality of fourth spacers.

19. The method of claim 15, further comprising:
coating a dam glue adjacent to an edge region of the back plate to form a dam layer.

\* \* \* \* \*